(12) United States Patent
Kumacheva et al.

(10) Patent No.: US 6,785,214 B2
(45) Date of Patent: Aug. 31, 2004

(54) POLYMERIC NANOCOMPOSITE MATERIALS WITH A FUNCTIONAL MATRIX AND METHOD OF READING AND WRITING THERETO

(75) Inventors: Eugenia Kumacheva, Toronto (CA); Olga Kalinina, Toronto (CA)

(73) Assignee: The Governing Council of the University of Toronto, Toronto (CA)

( * ) Notice: Subject to any disclaimer, the term of this patent is extended or adjusted under 35 U.S.C. 154(b) by 371 days.

(21) Appl. No.: 09/726,487

(22) Filed: Dec. 1, 2000

(65) Prior Publication Data

US 2001/0043546 A1 Nov. 22, 2001

Related U.S. Application Data

(60) Provisional application No. 60/168,386, filed on Dec. 2, 1999, and provisional application No. 60/168,385, filed on Dec. 2, 1999.

(51) Int. Cl.$^7$ ................................................ G11B 7/00
(52) U.S. Cl. ........................ 369/103; 369/288; 430/21
(58) Field of Search ........................... 369/103, 275.1, 369/275.2, 288, 284; 428/141, 323, 327, 407; 430/21, 138, 139, 252, 253, 257, 270.1

(56) References Cited

U.S. PATENT DOCUMENTS

| | | | |
|---|---|---|---|
| 5,126,226 A | * 6/1992 | Frohlich et al. | ............ 430/257 |
| 5,705,222 A | 1/1998 | Somasundaran et al. | |
| 5,952,131 A | 9/1999 | Kumacheva et al. | |
| 5,965,233 A | * 10/1999 | Tojo et al. | .................. 428/141 |
| 6,391,536 B2 | * 5/2002 | Yasuda et al. | .............. 430/619 |

FOREIGN PATENT DOCUMENTS

| | | |
|---|---|---|
| WO | 9941299 | 8/1999 |
| WO | 9947253 | 9/1999 |

OTHER PUBLICATIONS

Carbon Structures with Three–Dimensional Periodicity at Optical Wavelengths, Anvar A. Zakhido, et al, Science Magazine 1998 pps 1–9.

Synthesis of Macroporous Minerals with Highly Ordered Three–Dimensional Arrays of Spheroidal Voids, Brian T. Holland et al., Science Magazine 1998, pps 1–8.

Preparation of Photonic Crystals Made of Air Spheres in Titania, Judith E.G.J. Wijnhoven et al., Science Magazine 1998, pps 1–6.

Thin–Film Micropatterning Using Polymer Microspheres, F. Lenzmann et al., Institute of Materials Research, McMaster University, Hamilton, Ontario, Canada Chem Mater 1994, 6 156–159.

Polymerized colloidal crystal hydrogel films as intelligent chemical sensing materials, John H. Holtz et al., Nature 1997, 829–832.

Three–Dimensional Arrays in Polymer Nanocomposites by Eugenia Kumacheva et al., Adv Mater 1999, 11 No. 3 pps 231–234.

\* cited by examiner

*Primary Examiner*—Thang V. Tran
(74) *Attorney, Agent, or Firm*—Lynn C. Schumacher; Hill & Schumacher

(57) ABSTRACT

A nanocomposite material having a plurality of core particles formed of a core material. The core material has a first glass transition temperature. A shell encapsulates each core particle. The shell is formed of a shell material that has a second glass transition temperature less than the first glass transition temperature. When subjected to a temperature greater than the second glass transition temperature and less than the first glass transition temperature, the shells form a continuous matrix surrounding the core particles. The shell material includes a functional component that can be activated in response to an external excitation. This functional component can include either photosensitive, semiconductor, magnetic, piezoelectric or electro-active components just to mention a few. The different components may be chemically or physically bound to the shell or cores. These nanocomposite materials are used as storage media.

20 Claims, 8 Drawing Sheets

POLYMERIC NANOCOMPOSITE MATERIALS WITH A FUNCTIONAL MATRIX AND METHOD OF READING AND WRITING THERETO

CROSS REFERENCE TO RELATED UNITED STATES PATENT APPLICATION

This patent application is related to U.S. provisional patent application Ser. No. 60/168,385 filed on Dec. 2, 1999 entitled METHOD AND COMPOSITION FOR POLYMERIC NANOCOMPOSITE MATERIALS WITH A FUNCTIONAL MATRIX and U.S. provisional patent application Ser. No. 60/168,386 filed on Dec. 2, 1999 entitled POLYMER BASED NANOCOMPOSITES FOR MULTIPLE USE AND A METHOD OF READING AND WRITING THEREFOR.

FIELD OF INVENTION

The present invention relates to polymeric nanocomposite materials with a functional matrix and a method of producing such materials. In particular, the present invention relates to a method of producing polymer-based nanocomposite material in which a functional component, such as a fluorescent dye, is incorporated into either shell-forming polymer to form core-shell latex particles or into both the core and shell. The present invention also relates to use of these nanocomposite materials having multiple read/write capabilities at differing wavelengths for use a memory storage medium.

BACKGROUND OF THE INVENTION

Two-dimensional (2D) and three-dimensional (3D) ordered arrays of submicron colloid particles have attracted great interest in materials science. Generally, colloid crystals are employed either as templates for producing ordered 2D or 3D structures, (Holland, B T. Blanford, C F, Stein A. Science 1998, 281, 538; Zahidov, A. A. et al. *Science* 1998, 282, 897; Wijnhoven, J. E. G., Vos, W. L. *Science* 1998, 281, 802; Lenzmann, F., Li, K., Kitai, A. H., Stöver Chem. Mater. 1994, 6, 156) for example, in the fabrication of photonic bang gap materials or on their own right as chemical sensors (Holtz, J. H., Asher, S. A. Nature 1997, 389, 829) and devices for memory storage (Kumacheva, E.; O. Kalinina; Lilge, L. Adv. Mat. 1999, 11, 231). Recently, a new approach to producing 3D polymer-based nanocomposites has been proposed. This method employs latex particles composed of hard cores and somewhat softer shells (Kalinina, O.; Kumacheva. E. *Macromolecules* 1999, 32, 4122). FIG. 1 generally demonstrates the stages in fabrication of such a nanocomposite material from core-shell latex particles. Core-shell latex particles, composed of hard cores and somewhat softer shells, are synthesized at step A. The particles are packed in a close packed array, at step B, and annealed at step C at the temperature that is above the glass transition temperature, $T_g$, of the shell-forming polymer (SFP) and below the $T_g$ of the core-forming polymer (CFP). As a result, the latex shells flow and form a matrix, whereas the rigid cores form a disperse phase.

With this approach, it is known to incorporate functional components having different functionalities into the CFP. When the diffusion of the functional component between the cores and the shells is sufficiently suppressed, nanocomposite materials with a periodic modulation in composition are produced. It is also known to prepare materials with a direct structure in which fluorescent core particles are embedded into an optically Inert matrix. U.S. Pat. No. 5,952,131 to Kumacheva et al., the contents of which are incorporated herein by reference, discloses a material having a matrix composed of particles having a core resin and a shell resin. The core resin includes a covalently bonded photosensitive compound that can be selectively excited by light. Diffusion of the fluorescent dye from the cores to the shells was suppressed by covalently bonding the dye to the CFP and crosslinking the CFP at stage A, as shown in FIG. 1 of '131. The shell resin, when melted at a temperature less than the glass transition temperature of the core resin, forms a continuous phase matrix around the core resin. This material can be used to provide a two- or three-dimensional optical storage medium.

These prior art nanocomposite materials exhibit promising characteristics, especially as memory storage devices. However, by providing functional components in the shell forming polymer matrix, other uses for such nanocomposites, such as photosensitive film coatings, can be developed. While the material described in U.S. Pat. No. 5.952,131 has vastly greater storage capacities than conventional optical storage media, it is desirable to provide increased storage densities, and to increase the data retrieval rate from such media.

SUMMARY OF THE INVENTION

It is an object of the present invention to provide nanocomposite materials with a reverse structure such that a functional component, for example, a fluorescent dye, is incorporated into the shell-forming polymer matrix.

In a first embodiment, there is provided a nanocomposite material having a plurality of core particles formed of a core material. The core material has a first glass transition temperature. A shell encapsulates each core particle. The shell is formed of a shell material that has a second glass transition temperature less than the first glass transition temperature. When subjected to a temperature greater than the second glass transition temperature and less than the first glass transition temperature, the shells form a continuous matrix surrounding the core particles. The shell material includes a functional component that can be activated in response to an external excitation. This functional component may be either photosensitive, electro-active, magnetic, piezoelectric, or semiconductor components (it may be a functional polymer or an inert polymer containing chemically or physically incorporated functional species).

It is also an object of the present invention to provide a nanocomposite material that obviates or mitigates at least one disadvantage of the prior art. In particular, it is an object of the present invention to provide a nanocomposite material having an increased storage density, and to provide methods for reading and writing data to such material.

In a first embodiment, there is provided a nanocomposite material having a plurality of core particles formed of a core material that has a first glass transition temperature. A shell encapsulates each of the core particles. The shell is formed of a shell material that has a second glass transition temperature less than the first glass transition temperature. When subjected to a temperature greater than the second glass transition temperature but less than the first glass transition temperature, the shell material forms a continuous matrix surrounding the core particles. Either the shell material or the core material includes a first and a second functional component. The first functional component can be activated in response to a first source of external excitation, while the second functional component can be activated in response to a second source of external excitation. In a preferred embodiment, the first and second functional components are photosensitive dyes that are activated at different wavelengths, supplied by laser sources of different wavelengths. The material of the present invention is particularly suitable for use as a storage medium having multiple bits of data written and read at the same position in the material.

In a further aspect of the present invention, there is provided a method of recording information in the nanocomposite material. The method comprises the steps of selectively activating the first functional component with a first excitation source to addressably write first data, and selectively activating the second functional component with a second excitation source to addressably write second data. The information recorded in the core material using the first excitation source can be read using either the same first source or using another (third) source at a second wavelength if excitation with the first source brings the core material into another stable state. For example, the information can be recorded in the core material can by energizing a core particle with the first excitation source and detecting the information, appearing as a black mark, recorded at that wavelength on the core particle. For the shell materials, the information recorded with second source can be read either with the same source or by using the fourth source with the wavelength different than that of the second source. In a preferred, embodiment, the sources are orthogonally incident on the core particle, and can be energized concurrently.

BRIEF DESCRIPTION OF THE DRAWINGS

Preferred embodiments of the invention will now be described, by way of example only, with reference to the drawings, in which.

DETAILED DESCRIPTION OF THE INVENTION

Generally, the nanocomposite material of the present invention consists of a plurality of core particles and a shell for encapsulating each of the core particles. The core is formed of core material, hereinafter referred to as the core-forming polymer (CFP), having a first glass transition temperature. The shell is formed of a shell material, hereinafter referred to as a shell-forming polymer (SFP), having a second glass transition temperature less than the first glass transition temperature of the CFP. The SFP forms a continuous matrix surrounding the core particles when subjected to a temperature greater than the second glass transition temperature and less than said first glass transition temperature. The SFP includes a functional component that can be activated in response to an external excitation, such as particular wavelength of electromagnetic radiation. According to the present invention, the functional component is a material that can be activated by an external source, such as photosensitive components (Including molecules such as dyes and solids such as colloidal semiconductor particles) and electro-active and magneto-active components activated by electric or magnetic fields.

Figure 4:
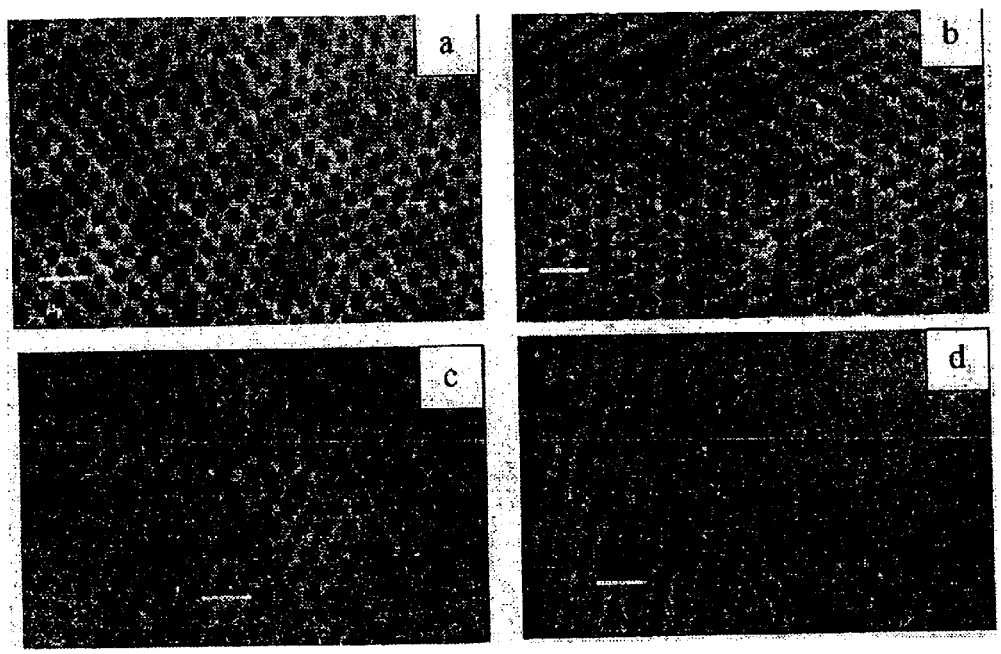
FIGS. 4a, 4b, 4c and 4d shows LCFM images of nanocomposite films obtained from latex dispersions a–d presented in Table 1 (scale bar is 2 μm)

The spherical core-shell latex particles can be synthesized by multistage emulsion polymerization using ionic and nonionic initiators at different stages of synthesis (Kalinina, O.; Kumacheva. E. *Macromolecules* 1999, 32, 4122). As shown in Table 1, four samples of core-shell latexes were formed. These four samples are of similar dimensions, having the same diameters of cores, thicknesses of shells, and total dimensions of the particles. The dispersions depend on the way a fluorescent dye is incorporated into the SFP, that is, covalent attachment versus mixing. Referring to FIG. 4, in latexes a and b the fluorescent dye is covalently attached to the SFP, whereas in samples c and d the dye Is swollen In the SFP. In another variation, the latexes a and C of the SFP are crosslinked.

Figure 2A:
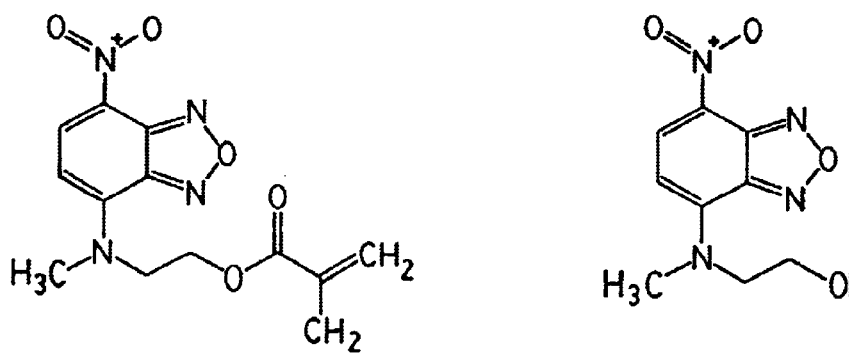
FIG. 2a shows the molecular structure of fluorescent components incorporated into shell-forming polymers according to the present invention.
Figure 2B:
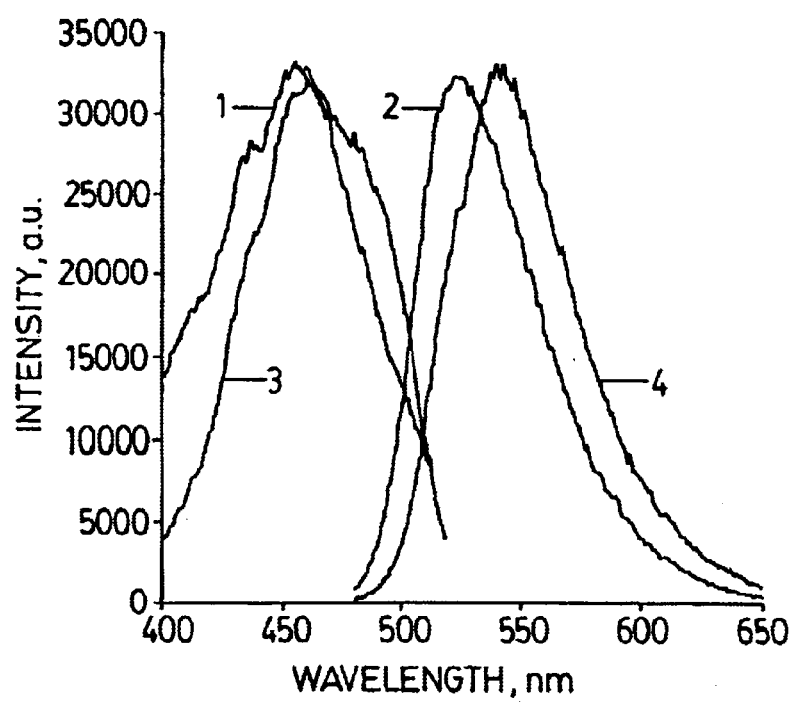
FIG. 2b shows the chemical structure of the fluorescent species incorporated into the shell-forming polymer (a) and their absorption and emission spectra (b). NBD-OH: absorption spectrum; (2) emission spectrum, NBD-MMA: (3) absorption spectrum; (4) emission spectrum.

The polymeric nanocomposite materials can be fabricated using a number of materials such as, methyl methacrylate (MMA), butyl methacrylate (BMA), dodecyl mercaptane (DDM). ethylene glycole dimethacrylate (EGDMA), 2,2'-azobis (isobutyronitrile) (AIBN), which are commercially available from Aldrich and a fluorescent dye 2-[methyl(7-nitro-2,1,3-benzodiazol-4-yl)amino]ethanol (NBD-OH) shown on FIG. 2(a), which can be synthesized using known methods. To attach the dye chemically to the SFP, a fluorescent comonomer 4-amino-7-nitrobenzo-2-oxa-1,3-diazol-MMA (NBD-MMA) was synthesized, as shown in FIG. 2b, and copolymerized with the monomers used in the synthesis of the latex shells. The materials, NBD-OH and NBD-MA, both have fluorescent properties.

As is well known by those skilled in the art, latex synthesis can be conducted in a number of ways. In a preferred embodiment crosslinked poly (methyl methacrylate) (PMMA) latex cores are synthesized in three stages, referring to Table 2. U.S. Pat. No. 5,952,131, to Kumacheva et al. details such preparation. The contents of this reference are incorporated herein by reference. Particle dimensions and size distribution are measured after each stage of synthesis using an electron microscope, such as the Hitachi scanning electron microscope, at an accelerating voltage of 15 kV. The resulting compositions of the core-forming polymer (CFP) and the shell-forming polymer (SFP) have the following general properties: $T_{g,SFP} > T_{room}$; $T_{g,SFP} < T_{annealing} < T_{g,CFP}$ where $T_{g,CFP}$ and $T_{g,SFP}$ are the glass transition temperatures of the CFP and the SFP, respectively, and $T_{annealing}$ is the annealing temperature at step C.

In an embodiment of the present Invention, latex dispersions a–d are diluted to ca. 5 weight % and settled in teflon containers. After water removal, dry sediments with the thickness of ca. 2 mm are annealed for 10 hours at temperatures that are slowly increased from 20 to 110° C. with a rate of ca. 9° C./hour. The structure of the annealed samples can be examined by, for example, laser confocal fluorescent microscopy (LCFM) using a Carl Zeiss LSM 510 confocal microscope with C-Apochromat 63×1, 3W objective lens. An excitation wavelength of 488 nm of Ar-ion laser that matches the absorption peaks of NBD-OH and NBD-MA at 450 nm is used. The lateral and vertical resolution of the LCFM measurements is 3 and 0.7 μm, respectively. The images can be analyzed using software, such as, ImageTool software from the Health Science Center, University of Texas, San Antonio, Tex.

Figure 3:
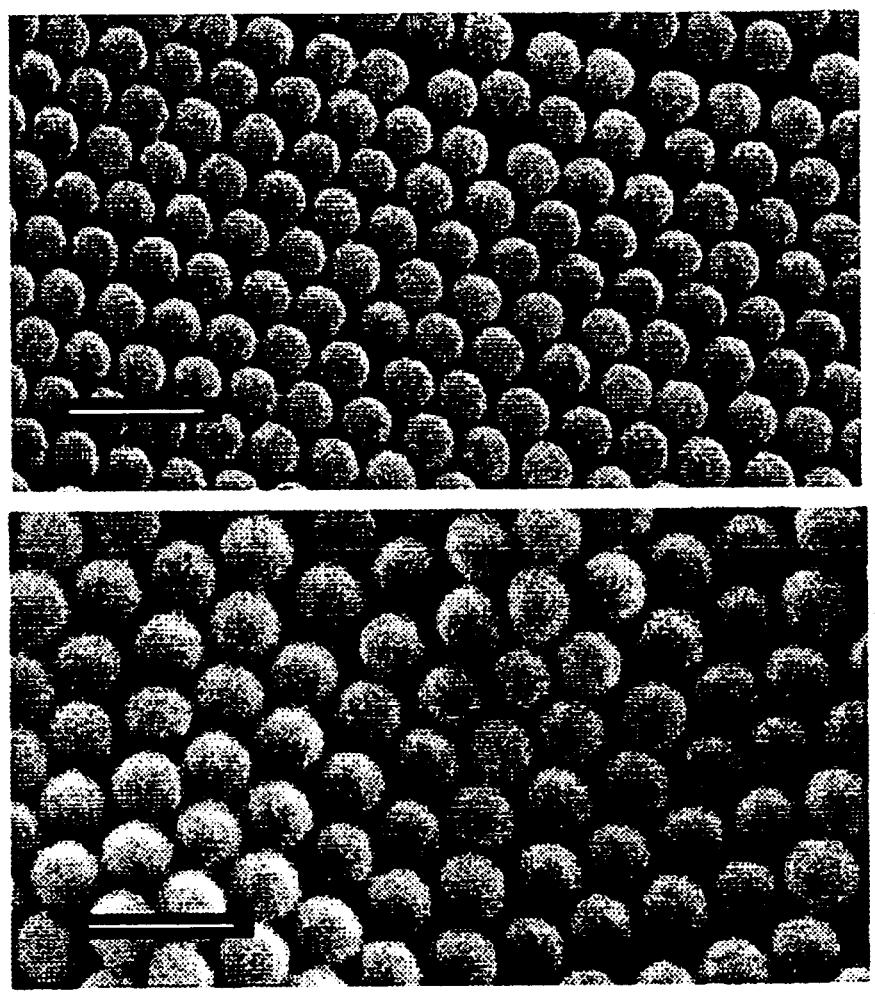
FIG. 3 shows SEM images of latex cores (upper micrograph) and core-shell particles (lower micrograph)

Referring to FIG. 3, the core (upper micrograph) and the core-shell particles (lower micrograph) are obtained at the end of stage 3, the latex shells composed of a copolymer of MMA and BMA (1:1) are synthesized on the surface of the core particles. Referring to FIG. 4, NBD-MA is copolymerized with MMA and BMA in dispersions a and b. In samples c and d, NBD-OH, as shown in FIG. 2(b), is mixed with MMA and BMA. In samples a and c, FIG. 4, a cross-linking agent EGDMA is introduced into the MMA-BMA monomer mixture to crosslink the SFP.

In a preferred embodiment, the diameter of the core particles is 0.7 μm, the diameter of the core-shell particles is 0.95 μm, and the thickness of shells is of ca. 0.13 μm. The polydispersity index after each stage did not exceed 1.03.

As shown in FIG. 4, the material of the present invention exhibits a periodic structure, that is, a fluorescent background corresponding to the SFP appears bright with dark inclusions formed by the CFP. The highest contrast between the matrix and the particles or the signal-to noise-ratio (STNR) is achieved in films shown in FIG. 4a, in which NBD-MA is covalently attached to crosslinked CFP. In FIG. 4(b), the dye is chemically attached, SFP is not crosslinked and the optical contrast between the CFP and the SFP domains is a somewhat lower but still comparable with that obtained In sample a. In another variation, the swelling of the dye in the SFP accompanied by polymer crosslinking leads to substantial reduction in the contrast between the particles and the matrix, as shown in FIG. 4(c). The lowest STNR is observed in FIG. 4(d), in which NBD-OH is mixed with SFP and SFP is not crosslinked. Referring to FIG. 4, the scale bar is 2 μm and images are taken at the distance 5 μm from the surface.

The partition of the fluorescent component between the CFP and the SFP can be characterized quantitatively by analyzing the variation in the fluorescence intensity in the nanocomposite films obtained from latexes a–d. Such comparison is possible because NBD-MA and NBD-OH incorporated into the latex shells have similar absorption and emission peaks, as is shown in FIG. 2. The samples of the dye were dissolved methanol (c=0.05 weight %) and the intensity of the emitted light and the position of the absorption and emission peaks were measured in fluorescence spectroscopy experiments.

Nanocomposite films were studied in laser confocal fluorescence microscopy (LCFM) experiments in which the microscope setting such as brightness, contrast, intensity of irradiation, the number of scans, and the position of the examined 2D plane are fixed for all materials of the present invention.

Figure 5:
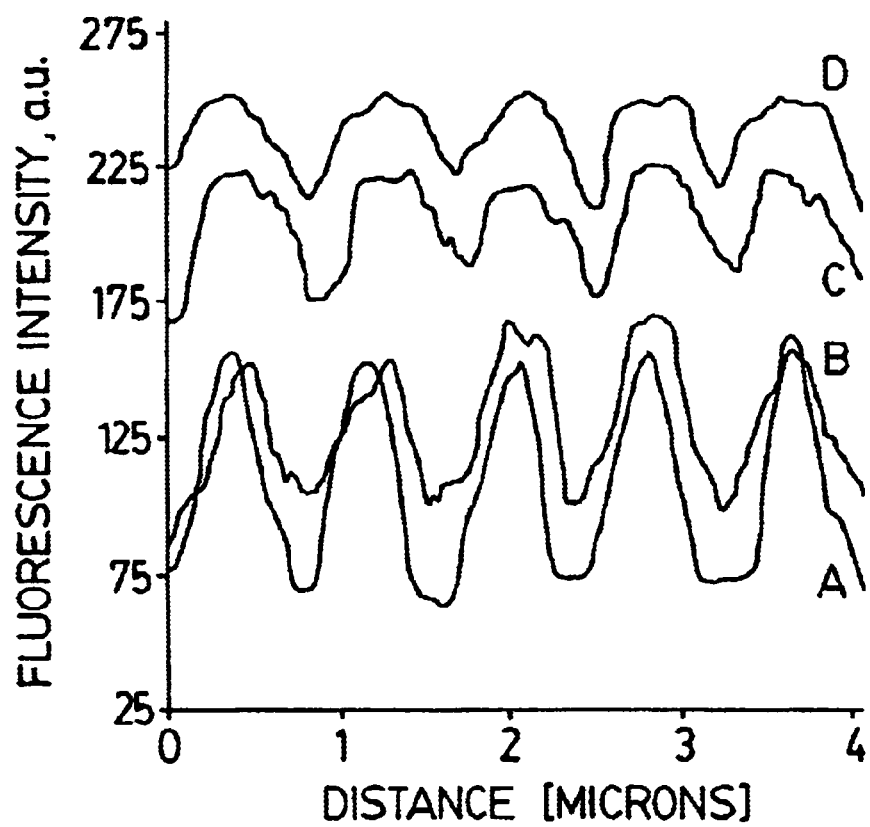
FIG. 5 shows distributions of fluorescent intensity in the nanocomposite films obtained from dispersions a–d in Table 1.

The fluorescence line profiles of the polymer films obtained from samples a–d are shown in FIG. 5. Two features are indicative. Firstly, it can be seen that in the films obtained from latexes a and b, the STNR is substantially higher than that for the films prepared from samples c and d. The average STNR (for the films obtained from latexes b, c, and d are of ca. 84%, 56%, and 44%, respectively, of the STNR measured in films prepared from dispersion a. This likely indicates that the chemical attachment of the fluorescent dye to the SFP has a greater effect on suppression of its diffusion than crosslinking of the SFP. Also, even for the worst scenario, that is swelling of the dye in the latex shells and no crosslinking of the SFP, the dye mostly resides in the SFP.

Secondly, it can be also observed that there is a gradual change in the width of the wells on the STNR curves. The wells correspond to the non-fluorescent core particles. Although precise measurements of the dimensions of the fluorescent and non-fluorescent domains are limited by the resolution of the LCFM, some qualitative conclusions can be made by comparing the profiles in FIG. 5 with the dimensions of the latex cores and shells in Table 2. The diameters of the latex cores are substantially larger than the thicknesses of the latex shells, thus the bottom of the wells on the STNR curves in FIG. 5 should appear broader than the humps corresponding to the fluorescent matrix. The average ratio of the well-to-hump width measured in the middle of the peaks underwent gradual decrease from 1.3 to 1.15, 0.74, and 0.68 for curves A, B, C, and D, respectively. The broadening of the fluorescent domains is believed to be a consequence of the diffusion of the fluorescent component into the CFP and can be used to study distribution of the functional component between the CFP and the SFP.

Therefore, it appears that chemical attachment of the dye to the shell-forming polymer accompanied by its crosslinking leads to sharp modulations in composition of the nanocomposite material. Cross-linking of the SFP is desirable but not critical for producing nanocomposites. Swelling of the dye in the SFP even when the polymer is crosslinked leads to substantial reduction in optical contrast between the particles and the matrix. Nevertheless, in these samples the difference in fluorescence between the CFP and the SFP is sufficient to resolve the particles and the matrix with LCFM.

The nanocomposite materials of the present invention can be used for a number of purposes, including optical and electro-active and magneto-active storage devices and photosensitive films. The chemical bonding of functional components and crosslinking of the shell-forming particles leads to sharper modulations in the composition of nanocomposite materials, but may not be required in applications where less sensitivity is needed.

Figure 6:
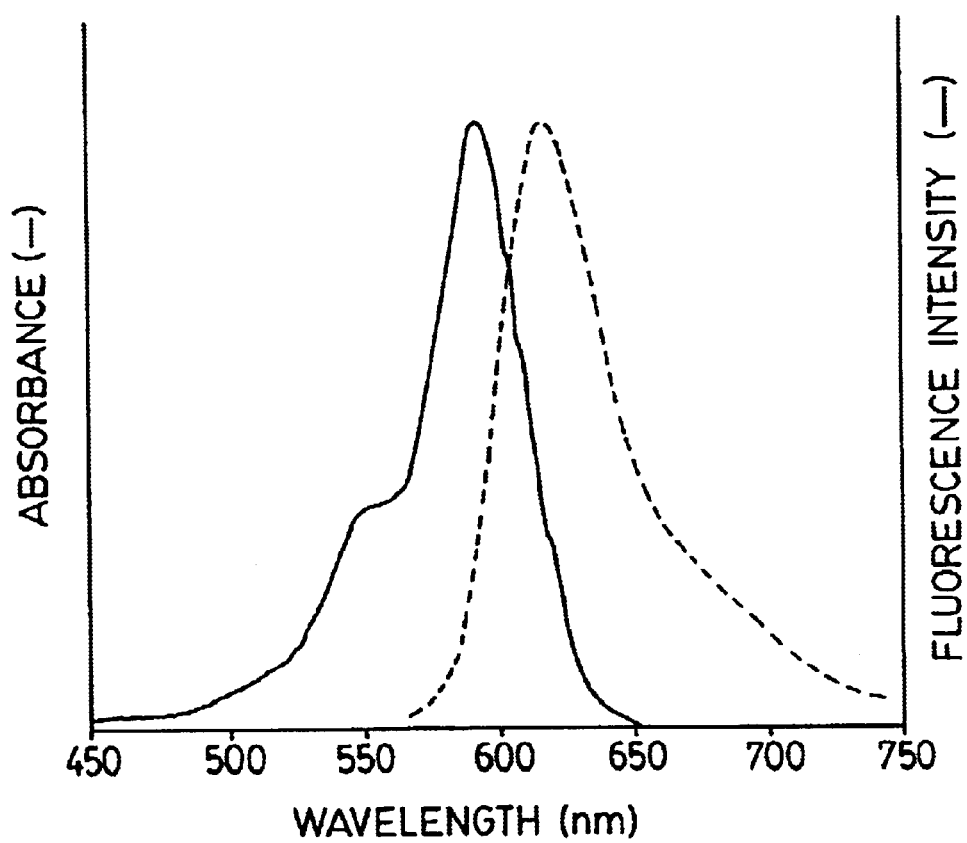
FIG. 6 shows the absorption and emission spectra of the fluorescent dye Texas Red.
Figure 7A:
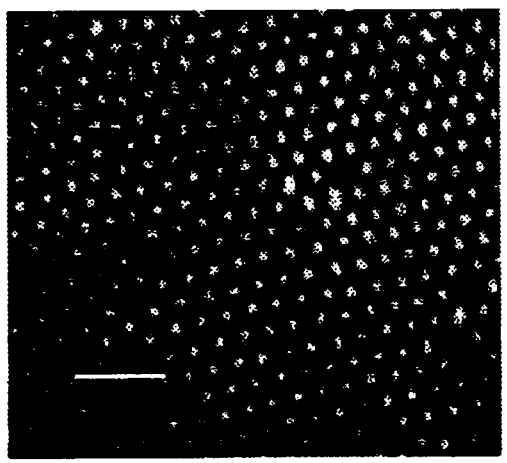
FIG. 7a shows the LCFM image of films when NBD was incorporated into the latex cores.
Figure 7B:
FIG. 7b shows the LCFM image of films when Texas Red was incorporated Into the latex shells (the scale bar is 5 μm)

In another embodiment of the invention, different functional components may be simultaneously incorporated into the cores and shells. Referring to FIG. 6, the spectra of another fluorescent dye Texas Red (1H,5H,11H, 15H-Xanthenol[2,3,4-ij:5,6,7-i'j']diquinolizin-18ium, 9-[2(or 4)[[[6-[2,5-dioxo-1-pyrrolidinyl)oxy]-6-oxohexyl]amino]sulfonyl]-4(or2)-sulfophenyl]-2,3,6,7,12,13,16,17-octahydro-,inner salt) incorporated into the shells (while NBD was attached to the core) is shown. FIG. 7a shows the LCFM image of films when NBD was incorporated into the latex cores. FIG. 7b shows the LCFM image of films when Texas Red was incorporated into the latex shells (the scale bar is 5 μm). By imaging the samples using 488 nm wavelength there is achieved a 'direct' structure, while by using 600 nm, there is achieved a 'reverse' structure. There are many different combinations that may be obtained by incorporating species with different functional properties into the cores and the shells.

It will be understood that the functionality of the shell-forming polymer may be obtained by using a pure polymer that possesses a particular property, e.g., photorefractivity, or have a high refractive index instead of having a separate functional component contained therein.

One advantageous use of the polymeric nanocomposite materials disclosed herein and described in detail in U.S. Pat. No. 5,952,131 to Kumacheva et al. with a functional matrix is as a memory storage medium.

Figure 1:
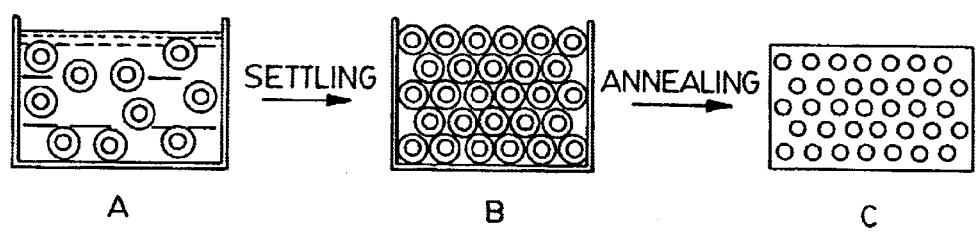
FIG. 1 is a schematic of a core-shell approach to producing polymer-based nanocomposite materials.

In a first embodiment of the materials disclosed herein useful for memory storage and retrieval, the core resin of the nanocomposite material is provided with at least two functional components, such as photosensitive fluorescent dye which can be excited at different wavelengths. The fluorescent dyes can be covalently bonded to the core resin, as Is well known In the art (as disclosed in U.S. Pat. No. 5,952, 131), or they can be physically mixed into the core resin such that the fluorescent dye is swollen into the core resin. In a preferred embodiment, three different fluorescent dyes are selected having excitation wavelengths separated by from about 200 nm–800 nm. The three dyes are covalently bonded to the core resin by copolymerization, and the particles are synthesized as described in U.S. Pat. No. 5,952,131, with an appropriate shell formed of shell resin. The nanocomposite material is then formed as shown in FIG. 1 having an ordered array of cores, each incorporating three dyes that can be activated at different wavelengths. The ordered array of cores is surrounded by an optically Inert matrix formed of the shell resin.

In a second embodiment of the present invention, the shell resin of the nanocomposite material Is provided with at least two functional components, such as photosensitive fluorescent molecules that can be excited at different wavelengths. The fluorescent dyes can be covalently bonded to the shell resin, or they can be physically mixed into the shell resin such that the fluorescent dye is swollen Into the shell resin. In a preferred embodiment, two fluroescent dyes are selected having excitation wavelengths separated by from about 300nm–800 nm. To attach the dyes chemically to the shell resin fluorescent comonomer are synthesized and copolymerized with the monomers used in the synthesis of the latex shells. The nanocomposite material is then formed as shown in FIG. 1. The resulting nanocomposite material incorporates an array of optically inert cores in a shell resin that can be locally activated by light of different wavelengths.

Similarly, other types of components (e.g. piezoelectric, semiconducting, electro-active, magnetic) may be incorporated in the cores or shells by reacting with the core or shell material or being physically encapsulated by the relevant phase.

Figure 8:
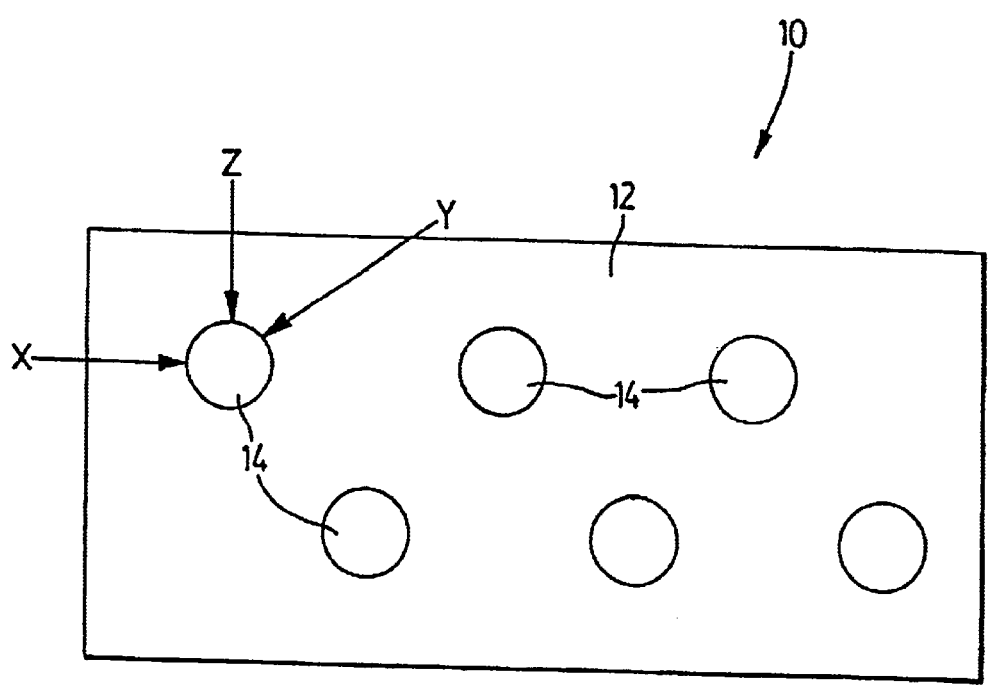
FIG. 8 is a schematic of a method for reading and writing information to the nanocomposite material of FIG. 1.

Once the nanocomposite material of the present invention has been formed, In accordance with either embodiment of the present invention, a material suitable for optical memory storage is created. The following is a description by way of example only, of methods of writing and reading information to the nanocomposite material of the preferred embodiment, having three fluorescent dyes incorporated in each core. Referring to FIG. 8, to write or record information to a nanocomposite material 10, three lasers or other light sources, each tuned to the excitation wavelength of one of fluorescent dyes, are focused in a particular plane of the nanocomposite material such that they are incident on a particular core 14 (embedded in the shell 12), as shown by the arrows x, y, z in FIG. 8. In a preferred embodiment, the laser beams are incident along orthogonal axes x, y and z. However, the angles of incidence can vary from that shown. The laser irradiation induces photo-bleaching of the photosensitive fluorescent dyes incorporated into the cores 14 at the selected wavelengths. This photo-bleaching changes the core to black when subsequently viewed at the excitation wavelength. The lasers are selectively energized to record a bit of information on the core, at each of the wavelengths, and are then scanned across other cores in the current plane, and across cores in other planes, of the nanocomposite material to record subsequent bits. In this manner, three bits of information can be recorded on each core particle, greatly increasing the storage density of the nanocomposite material.

To read the recorded information, three lasers, or other light sources, are again focussed on a plane of the nanocomposite. The lasers are tuned to the excitation wavelengths of the dyes, but are energized at a lower level, such as a 25 fold lower level, to read the information in a presently preferred embodiment, the lasers are again arranged to be incident on the cores at orthogonal axes, as shown in FIG. 8. Each laser is energized, and a detectors in the reading apparatus for each wavelength determine whether the core appears as a black mark, or not, at that particular wavelength. The lasers are scanned across the material to read subsequent core bit values, and to retrieve the recorded information. As will be apparent to those of skill in the art, the speed of retrieval is be greatly improved, since three times as much information can be read on each scan, and one-third less movement is required to read an equal amount of data as stored on prior art nanocomposite materials.

The above-described embodiments of the invention are intended to be examples of the present invention and alterations and modifications may be effected thereto, by those of skill in the art, without departing from the scope of

TABLE 1

Characterization of the core-shell particles used for fabrication of the polymer nanocomposite

| Sample | Dye | Cross-linking of the CFP | Diameter of the core/total diameter of core-shell latex particle, μm |
|---|---|---|---|
| a | Covalently attached to the SFP | Yes | 0.7/0.95 |
| b | Covalently attached to the SFP | No | 0.7/0.95 |
| c | Swollen in the SFP | Yes | 0.7/0.95 |
| d | Swollen in the SFP | No | 0.70/0.95 |

TABLE 2

Latex core synthesis procedure

| | Flask content | Pumping | Diameter μm |
|---|---|---|---|
| Stage 1: Synthesis of cores | 70 g H$_2$O, 0.18 g K$_2$S$_2$O$_8$ | 30 g MMA, 0.088 g DDM | 0.45 |
| Stage 2: Synthesis of cores | 30 ml seed from stage 1, 90 g H$_2$O | 7.5 g MMA, 7.5 g BMA, 0.044 g DDM, 0.375 g EGDMA. 0.1 g AIBN | 0.63 |
| Stage 3, Step 1: Synthesis of Cores | 20 ml seed from stage 2, 50 g H$_2$O | 1.5 g 0.1% K$_2$S$_2$O$_8$ in water, 2 g MMA, 2 g BMA, 0.0117 g DDM, 0.1 g EGDMA, 0.027 g AIBN | 0.7 |
| Step 2: Synthesis of Shells | | 2 g 0.1% K$_2$S$_2$O$_8$ in water 4 g monomer mixture 1, 2, 3, or 4*, 0.025 g AIBN | 0.87 |
| Step 3: Synthesis of Shells | | 2 g 0.1% K$_2$S$_2$O$_8$ in water 4 g monomer mixture 1, 2, 3, or 4*, 0.025 g AIBN | 0.95 |

*Monomer mixtures 1, 2, 3, and 4 were pumped into the flask to obtain latexes a, b, c, and d, respectively. Monomer mixture 1: 5 g MMA, 5 g BMA, 0.029 g DDM, 0.006 g NBD-MA, 0.25 g EGDMA. Monomer mixture 2: 5 g MMA, 5 g BMA, 0.029 g DDM, 0.006 g NBD-MA. Monomer mixture 3: 5 g MMA, 5 g BMA, 0.029 g DDM, 0.0045 g NBD-OH, 0.25 g EGDMA. Monomer mixture 4: 5 g MMA, 5 g BMA, 0.029 g DDM, 0.0045 g NBD-OH.

We claim:

1. A nanocomposite material, comprising:
   a plurality of core particles formed of a core material having a first glass transition temperature; and
   a shell for encapsulating each said core particles, said shell formed of a shell material having a second glass transition temperature less than said first glass transition temperature to form a continuous matrix surrounding said core particles when subjected to a temperature greater than said second glass transition temperature and less than said first glass transition temperature, said shell material including a functional component activatable in response to an external excitation.

2. A nanocomposite material according to claim 1, wherein the functional component is a photosensitive component.

3. A nanocomposite material according to claim 1, wherein the functional component is an electro-active component.

4. A nanocomposite material according to claim 1, wherein the functional component is a semiconductor component.

5. A nanocomposite material according to claim 1, wherein the functional component is a magnetic component.

6. A nanocomposite material according to claim 1, wherein the functional component is chemically bound to said shell.

7. A nanocomposite material according to claim 1, wherein the functional component is physically entrapped in said shell.

8. A nanocomposite material according to claim 1, wherein said core material includes a functional component activatable in response to an external excitation.

9. A nanocomposite material according to claim 8, wherein the functional component is a photosensitive component.

10. A nanocomposite material according to claim 8, wherein the functional component is an electro-active component.

11. A nanocomposite material according to claim 8, wherein the functional component is a semiconductor component.

12. A nanocomposite material according to claim 8, wherein the functional component is a magnetic component.

13. A nanocomposite material according to claim 6, wherein the functional component is chemically bound to said shell.

14. A nanocomposite material according to claim 6, wherein the functional component is physically entrapped in said shell.

15. A nanocomposite material, comprising:
    a plurality of core particles formed of a core material having a first glass transition temperature;
    a shell for encapsulating each said core particles, said shell formed of a shell material having a second glass transition temperature less than said first glass transition temperature to form a continuous matrix surrounding said core particles when subjected to a temperature greater than said second glass transition temperature;
    one of said shell material and said core material including a first and a second functional component, said first functional component being excitable in response to a first external excitation, said second functional component being excitable in response to a second external excitation.

16. A method of recording information in the nanocomposite material of claim 15, comprising the steps of;
    (i) selectively activating said first functional component with a first excitation source to addressably write first data; and
    (ii) selectively activating said second functional component with a second excitation source to addressably write second data.

17. A method according to claim 16, wherein said steps of activating are concurrent.

18. A method of retrieving information from the nanocomposite material recorded in accordance with the method of claim 17, comprising the steps of:
    (i) energizing a core particle with said first excitation source;
    (ii) detecting a first information value of said core particle;
    (iii) energizing said core particle with said second excitation source;
    (iv) detecting a second information value of said core particle.

19. A method according to claim 18, wherein said first and second excitation sources are orthogonal.

20. A method according to claim 18, wherein said first and second excitation sources energized concurrently.

* * * * *